United States Patent
Zhang et al.

(10) Patent No.: US 10,622,324 B2
(45) Date of Patent: Apr. 14, 2020

(54) BUMP STRUCTURES FOR HIGH DENSITY FLIP CHIP INTERCONNECTION

(71) Applicant: Sensors Unlimited, Inc., Princeton, NJ (US)

(72) Inventors: Wei Zhang, West Windsor, NJ (US);
Wei Huang, Plainsborough, NJ (US);
Joshua Lund, Dallas, TX (US);
Namwoong Paik, Lawrenceville, NJ (US)

(73) Assignee: Sensors Unlimited, Inc., Princeton, NJ (US)

( * ) Notice: Subject to any disclaimer, the term of this patent is extended or adjusted under 35 U.S.C. 154(b) by 11 days.

(21) Appl. No.: 15/891,889

(22) Filed: Feb. 8, 2018

(65) Prior Publication Data

US 2019/0244924 A1    Aug. 8, 2019

(51) Int. Cl.
*H01L 23/00*    (2006.01)
*H01L 21/48*    (2006.01)
*H01L 23/13*    (2006.01)
*H01L 27/146*   (2006.01)
*H01L 23/498*   (2006.01)

(52) U.S. Cl.
CPC .......... *H01L 24/14* (2013.01); *H01L 21/4853* (2013.01); *H01L 21/4857* (2013.01); *H01L 23/13* (2013.01); *H01L 23/49816* (2013.01); *H01L 24/11* (2013.01); *H01L 24/81* (2013.01); *H01L 27/1469* (2013.01); *H01L 27/14636* (2013.01); *H01L 27/14643* (2013.01)

(58) Field of Classification Search
None
See application file for complete search history.

(56) References Cited

U.S. PATENT DOCUMENTS

| 5,607,600 | A  | 3/1997  | Belcher et al. |
| 9,029,259 | B2 | 5/2015  | Stupar et al. |
| 9,780,240 | B2 | 10/2017 | Lu et al. |
| 2010/0038539 | A1* | 2/2010 | Endres ............ H01L 27/14636 250/332 |
| 2014/0061911 | A1* | 3/2014 | Cooper ................ H01L 24/14 257/741 |

* cited by examiner

*Primary Examiner* — Nilufa Rahim
(74) *Attorney, Agent, or Firm* — Locke Lord LLP; Scott D. Wofsy; Joshua L. Jones

(57) ABSTRACT

A method of forming bump structures for interconnecting components includes applying an insulating layer over a device substrate, coating the insulating layer with a dielectric material layer, forming a pattern with photolithography on the dielectric material layer, etching the dielectric material layer to transfer the pattern to the insulating layer, etching the insulating layer to form pockets in the insulating layer following the pattern, applying photolithography to and etching the dielectric material layer to reduce overhang of the dielectric material layer relative to the insulating layer, removing material from top and side walls of the pockets in the insulating layer, and depositing electrically conductive bump material in the pattern so a respective bump is formed in each pocket.

7 Claims, 4 Drawing Sheets

BUMP STRUCTURES FOR HIGH DENSITY FLIP CHIP INTERCONNECTION

BACKGROUND OF THE INVENTION

1. Field of the Invention

The present disclosure relates to interconnections, and more particularly to bump structures for electrically interconnecting components such as in interconnecting focal plane array components.

2. Description of Related Art

For small pixel pitch Focal Plane Array (FPA) application, flip chip hybridization provides advantages over the wire bonding process, such as high I/O density and short interconnect distance between the photodiode array (PDA) and the readout integrated circuit (ROIC), which lead to high device performance and miniature devices. Indium has become the ideal mating material because of its high ductility at low temperature. However, due to the bowing of the dies, especially for large sized FPAs, the misalignment caused by the lateral shifting becomes more significant. The lateral expansion of the bumps during the hybridization process could cause the shortage with the neighbor bumps, which result in the shorting pixels. The minimization of pitch sizes is therefore limited. The wicking process also becomes more challenging as die size increases and pitch sizes become finer.

The conventional techniques have been considered satisfactory for their intended purpose. However, there is an ever present need for improved bump structures for interconnecting devices. This disclosure provides a solution for this need.

SUMMARY OF THE INVENTION

A method of forming bump structures for interconnecting components includes applying an insulating layer over a device substrate, coating the insulating layer with a dielectric material layer, forming a pattern with photolithography on the dielectric material layer, etching the dielectric material layer to transfer the pattern to the insulating layer, etching the insulating layer to form pockets in the insulating layer following the pattern, applying photolithography to and etching the dielectric material layer to reduce overhang of the dielectric material layer relative to the insulating layer, removing material from top and side walls of the pockets in the insulating layer, and depositing electrically conductive bump material in the pattern so a respective bump is formed in each pocket.

Each respective bump can have a height to width aspect ratio greater than or equal to 2 wherein height is normal to the device substrate and width is normal to height. It is also contemplated that after pressing another device with a substrate to the device substrate, a total substrate to substrate height over the bump width aspect ratio can be 4:1 or greater The device substrate can include one of a photodiode array (PDA) or a read-out integrated circuit (ROIC), wherein the pockets and bumps are female bump structures. The method can include pressing a second device that is a ROIC to the PDA if the device substrate includes a PDA, or pressing a second device that is a PDA to the ROIC if the device substrate includes a ROIC, wherein male bump structures of the second device substrate are aligned with respective female bump structures in the insulating layer to press bumps of the second device substrate together with respective bumps in the pockets to electrically connect the PDA to the ROIC.

The insulating layer can include at least one of polymethyl methacrylate (PMMA) and/or Polyimide. Applying an insulating layer over a device substrate can include making the insulating layer at least 5 µm thick. The dielectric material layer can include at least one of $SiN_X$ and/or $SiO_XN_X$. Etching the dielectric material layer to transfer the pattern to the insulating layer can include at least one of Reactive Ion Etching (RIE) and/or Inductive Coupled Plasma (ICP) etching, and etching the insulating layer to form pockets can include ICP dry etching the insulating layer. Applying photolithography to and etching the dielectric layer to reduce overhang can include at least one of Reactive Ion Etching (RIE) and/or Inductive Coupled Plasma (ICP) dry etching. Removing material from top and side walls of the pockets can include introducing oxygen plasma through Inductive Coupled Plasma (ICP) etching. Depositing electrically conductive bump material can include depositing Indium. Depositing Indium can include depositing Indium at a deposition rate over 100 Angstrom/Second at a temperature of about −30° C. at a base pressure and deposition pressure of about $10^{-7}$ Torr for highly directional deposition of the bumps. Depositing Indium can include depositing Indium to have a grain size in the submicron range.

A system includes a device substrate, a layer of insulating material on the device substrate with pockets therein, and a respective electrically conductive bump seated in each pocket. The layer of insulating material is thicker than the bumps are tall so that the bumps are recessed within the pockets to form female bump structures for electrical connection with corresponding male bump structures.

The device substrate can include a PDA, and a ROIC with male bump structures can be aligned with and electrically connected to the female bump structures. It is also contemplated that the device substrate can include a ROIC, and a PDA with male bump structures can be aligned with and electrically connected to the female bump structures. The device substrate that includes the PDA can be spaced apart over 5 µm from the device substrate that includes the ROIC. The PDA and ROIC can define a plurality of pixels, wherein the plurality of pixels have a pitch size, wherein the pitch size is less than 10 µm.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
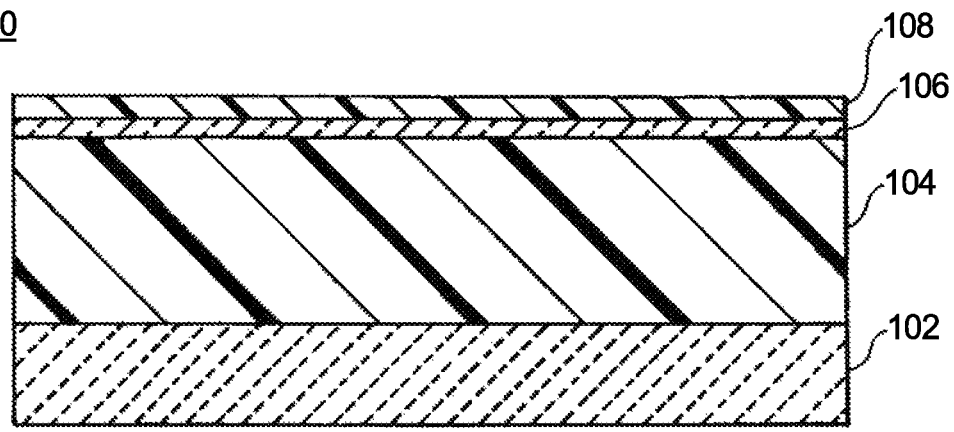
FIG. 1 is a schematic cross-sectional view of an exemplary embodiment of a system constructed in accordance with the present disclosure, showing insulating material deposited on a device substrate before etching.

Reference will now be made to the drawings wherein like reference numerals identify similar structural features or aspects of the subject disclosure. For purposes of explanation and illustration, and not limitation, a partial view of an exemplary embodiment of a system in accordance with the disclosure is shown in FIG. 1 and is designated generally by reference character 100. Other embodiments of systems in accordance with the disclosure, or aspects thereof, are provided in FIGS. 2-8, as will be described. The systems and methods described herein can be used for interconnections in focal plane arrays (FPAs) and the like.

A method of forming bump structures for interconnecting components includes applying an insulating layer 104 over a device substrate 102 and coating the insulating layer 104 with a dielectric material layer 106. The insulating layer 104 can include at least one of polymethyl methacrylate (PMMA) and/or Polyimide, and can be applied to be at least 5 μm thick. The dielectric material layer 106 can include at least one of $SiN_X$ and/or $SiO_XN_X$, and provides a barrier for etching the correct pattern in the insulating layer 104, which is described below. A layer 108 of photoresist is used to form a pattern with photolithography on the dielectric material layer 106.

Figure 2:
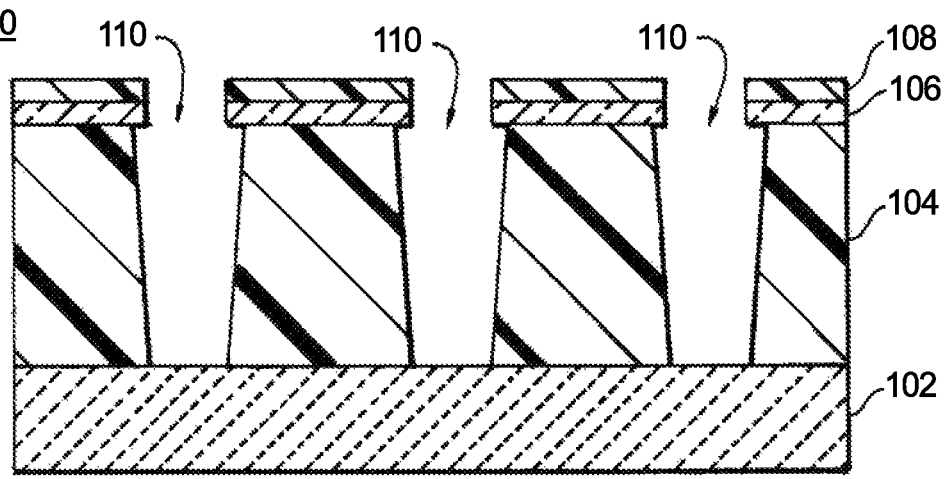
FIG. 2 is a schematic cross-sectional elevation view of the system of FIG. 1, showing the insulating layer after etching the pockets.
Figure 3:
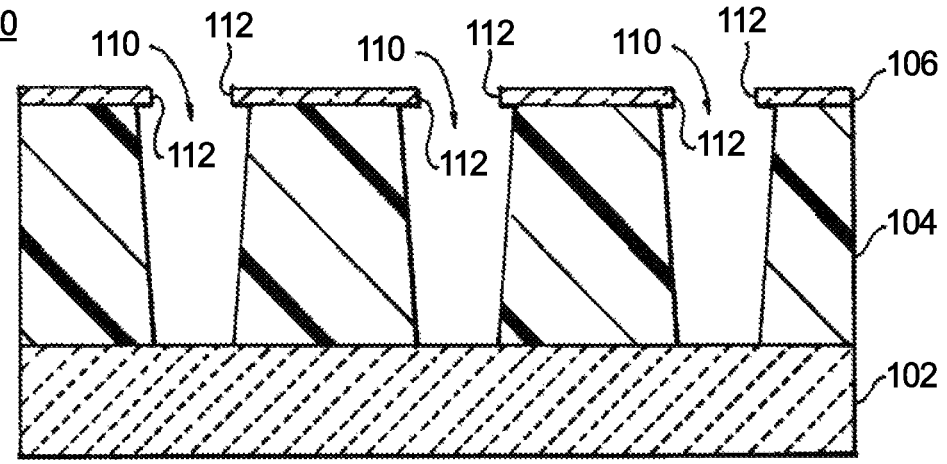
FIG. 3 is a schematic cross-sectional elevation view of the system of FIG. 1, showing overhang of the dielectric material relative to the pockets in the layer of insulating layer.

As shown in FIG. 2, the method includes etching the dielectric material layer 106 to transfer the pattern to the insulating layer 104, and etching the insulating layer 104 to form pockets 110 in the insulating layer 104 following the pattern. Etching the dielectric material layer 106 to transfer the pattern to the insulating layer 104 can include at least one of Reactive Ion Etching (RIE) and/or Inductive Coupled Plasma (ICP) etching, and wherein etching the insulating layer 104 to form pockets 110 includes ICP dry etching the insulating layer 104. FIG. 3 shows system 100 after etching out the pockets 110, and after removal of the layer 108 of photoresist.

Figure 4:
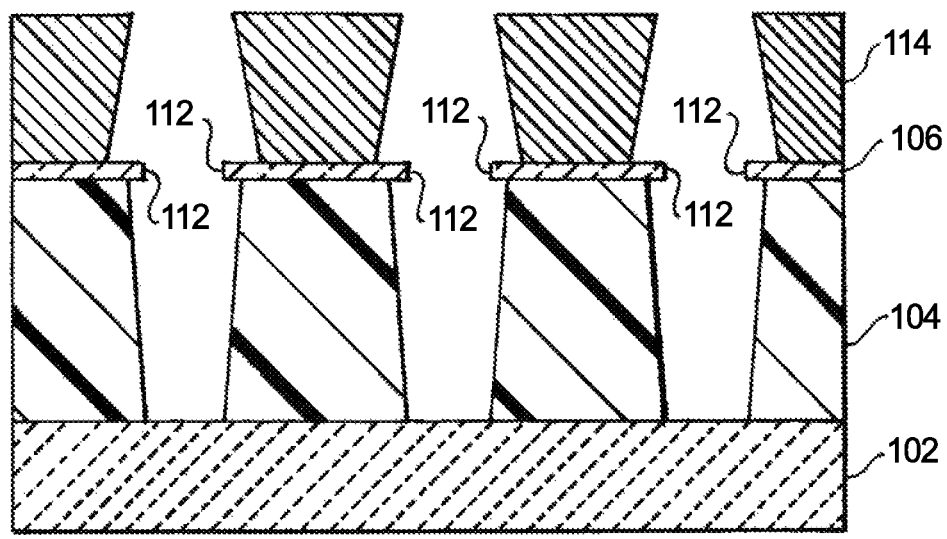
FIG. 4 is a schematic cross-sectional elevation view of the system of FIG. 1, showing photoresist on the dielectric layer.
Figure 5:
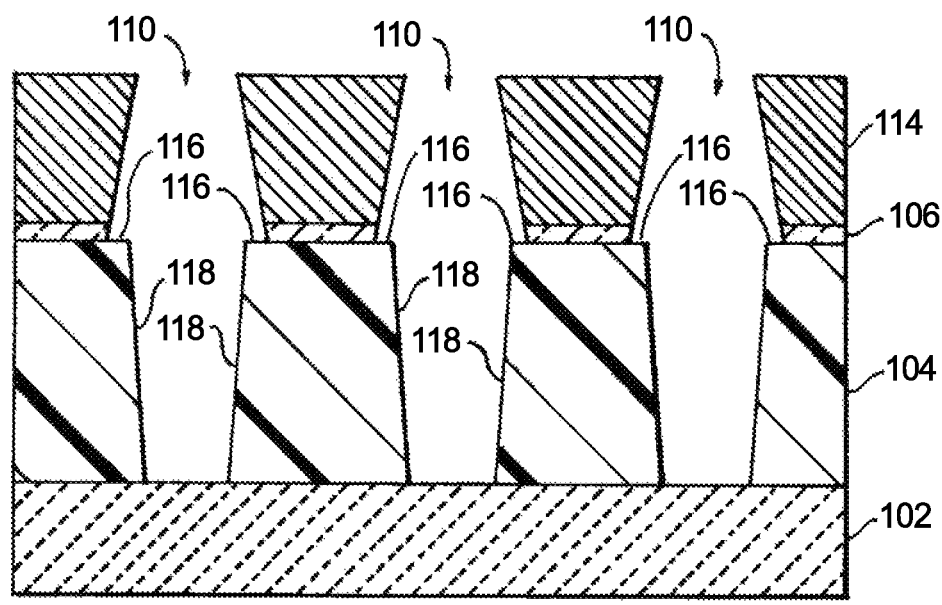
FIG. 5 is a schematic cross-sectional elevation view of the system of FIG. 1, showing the dielectric layer after etching to reduce or eliminate overhang of the dielectric layer relative to the insulating layer.
Figure 6:
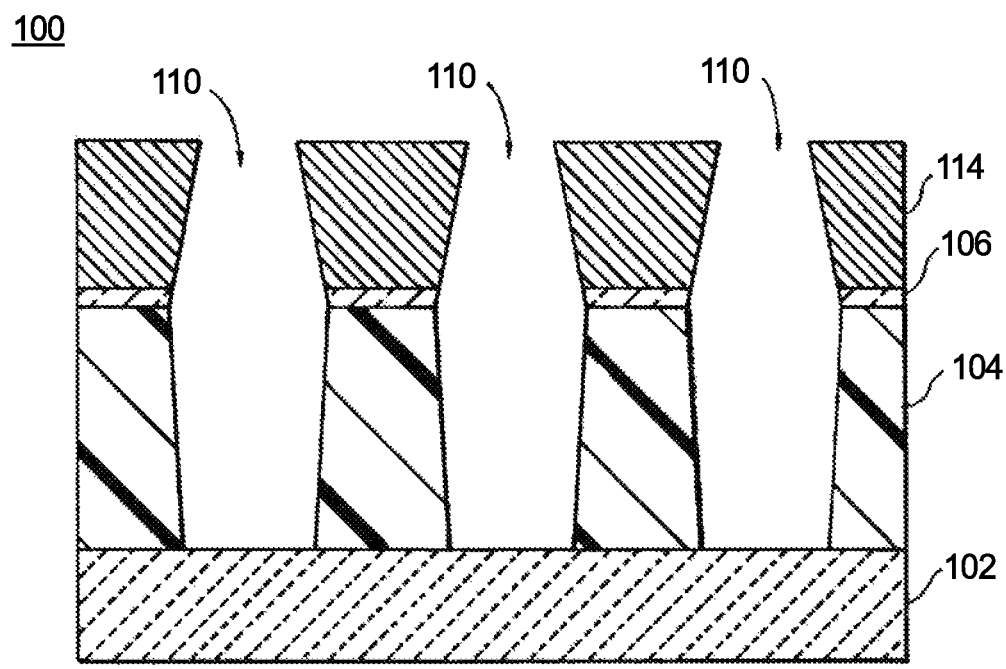
FIG. 6 is a schematic cross-sectional elevation view of the system of FIG. 1, showing removal of excess material from the insulating layer.

The dielectric material layer 106 can be left at this stage with overhanging portions 112 that overhang relative to the insulating layer 104. The method includes applying photolithography to the dielectric material layer 106. FIG. 4 shows a new layer of photoresist 114 deposited in a pattern over the dielectric material layer 106. At this stage, the dielectric material layer 106 can be etched to reduce or eliminate the overhang of the dielectric material layer 106 relative to the insulating layer 104, the result of which is shown in FIG. 5. Applying photolithography to and etching the dielectric layer 106 to reduce overhang can include at least one of Reactive Ion Etching (RIE) and/or Inductive Coupled Plasma (ICP) dry etching.

With continued reference to FIG. 5, at this stage, there may remain top walls 116 and side walls 118 that constitute excess material in the pockets 110 of the insulating layer 104 which could undesirably accumulate metal during bump deposition (bump deposition is described below). To reduce or eliminate the excess material in the pockets 110, material is removed from the top and side walls 116 and 118 of the pockets 110 in the insulating layer 104, resulting in the stage shown in FIG. 6. Removing material from top and side walls of the pockets 110 can include introducing oxygen plasma through Inductive Coupled Plasma (ICP) etching. This removal of material allows the side walls 118 of the pockets 110 to be tailored for the Indium evaporation process described below.

Figure 7:
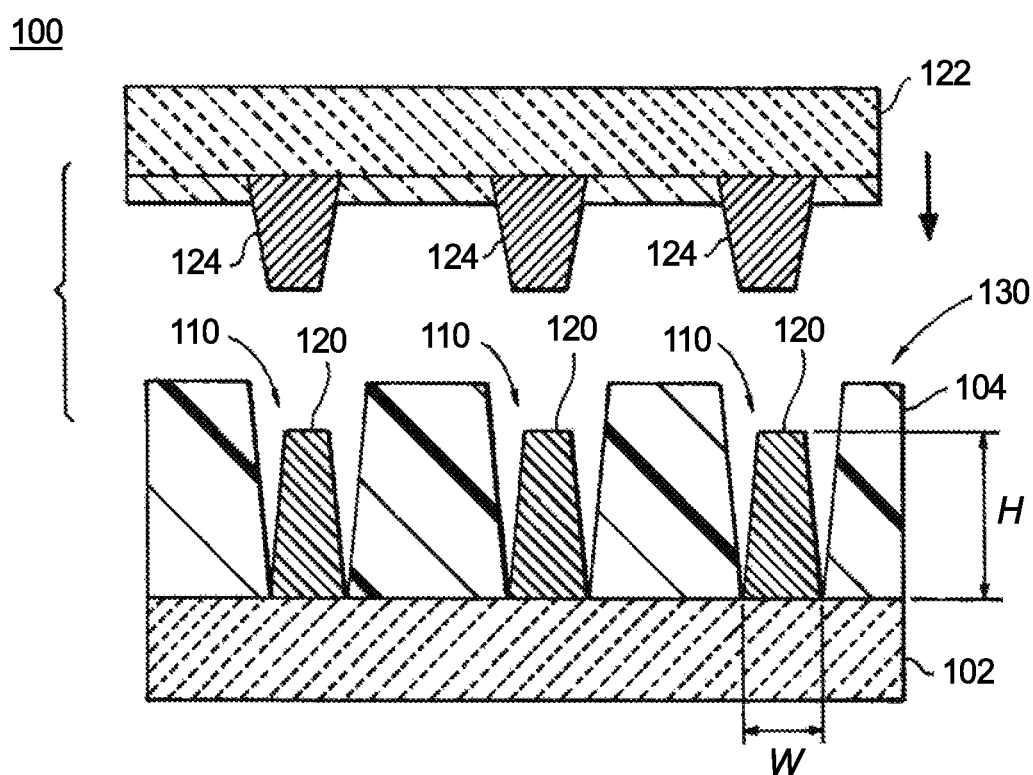
FIG. 7 is a schematic cross-sectional elevation view of the system of FIG. 1, showing alignment of a readout integrated circuit (ROIC) with a photodiode array (PDA), one of which includes female bump structures deposited in the pockets of FIG. 6.

With reference now to FIG. 7, electrically conductive bump material is deposited, e.g., by evaporation, in the pattern so a respective bump 120 is formed in each pocket 110. At this point, the new layer of photoresist 114 can be removed in a liftoff process, and dielectric layer 106 can optionally be removed using RIE or ICP etching, or the like. Each respective bump 120 has a height to width aspect ratio greater than or equal to 2 wherein height H is normal to the device substrate 102 and width W is normal to height H, as indicated in FIG. 7. The layer of insulating material 104 is thicker than the bumps 120 are tall so the bumps 120 are recessed below the surface 130 of the insulating layer 104 opposite the device substrate 102. In this way, the pockets 110 and bumps 120 can perform as female bump structures for interconnection with male bump structures. Depositing electrically conductive bump material can include depositing Indium at a deposition rate over 100 Angstrom/Second at a temperature of about −30° C. at a base pressure and deposition pressure of about $10^{-7}$ Torr for highly directional deposition of the bumps. Depositing Indium can include depositing Indium to have a grain size in the submicron range in the bumps 120. The bumps 120 are spaced apart from side walls 118, and this spare space accommodates lateral movement of material in bumps 120 during pressing as described below, to reduce or prevent bump material being squeezed out of the pockets 110 and shorting on neighboring bumps 120.

Figure 8:
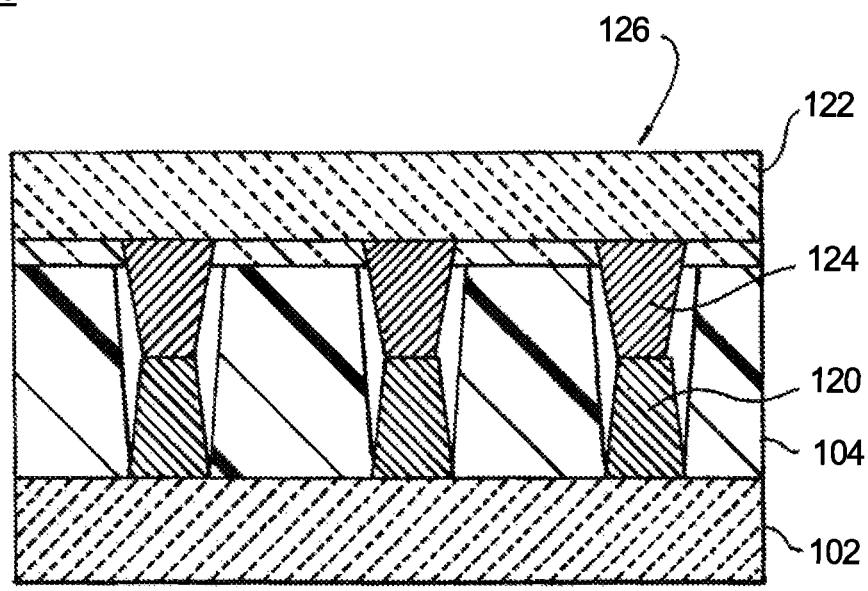
FIG. 8 is a schematic cross-sectional elevation view of the system of FIG. 1, showing the ROIC and PDA pressed together with electrical connections across the respective bumps.

The device substrate 102 can include or be part of either a photodiode array (PDA) or a read-out integrated circuit (ROIC). The method can include pressing a second device substrate 122 that is a ROIC to the PDA if the device substrate 102 includes a PDA, or pressing a second device substrate 122 that is a PDA to the ROIC if the device substrate 102 includes a ROIC. Male bump structures 124 of the second device substrate 122 are aligned with respective female bump structures, including pockets 110 and bumps 120, in the insulating layer 104 to press the bumps of the bump structures 124 of the second device substrate 122 together with respective bumps 120 in the pockets 110 to electrically connect the PDA to the ROIC and form a focal plane array FPA 126 as shown in FIG. 8. Connecting a PDA to a ROIC with bumps can be referred to as hybridization. The device substrate that includes the PDA can be spaced apart over 5 μm from the device substrate that includes the ROIC. The PDA and ROIC can define a plurality of pixels, wherein the plurality of pixels have a pitch size, wherein the pitch size is less than 10 µm.

Male and female bump structures for interconnecting components such as focal plane arrays as described herein offer potential benefits over traditional techniques and configurations. Compared with traditional configurations and techniques, systems and methods described herein isolate the neighboring bumps so as to effectively prevent the bumps from shorting each other by using PMMA/Polyimide as insulation media. In this way the long plasma enhanced chemical vapor deposition (PECVD) process as well as the dry etch processing time for SiOx dielectric required in traditional techniques are no longer needed, which means significant time and cost saving. In addition, the long process down time required for PECVD and etching tool cleaning in traditional techniques can be cut down to zero using structures as disclosed herein. Also in this disclosure, thicker insulation from Polyimide/PMMA is achieved, which can be more than 5 µm tall compared with 3 µm at most in traditional techniques. This disclosure also provides for higher aspect ratio Indium bumps from evaporation, i.e. the aspect ratio can be 2:1 or more as compared to 1:1 in the traditional techniques. The total aspect ratio after pressing, e.g., the total substrate to substrate height over the bump width W can be 4:1 or greater. These factors favor the compensation of sheer stress due to the thermal mismatch between the PDA and ROIC materials. The disclosed bump structures can advantageously be formed on either a photodiode array (PDA) or a read-out integrated circuit (ROIC). The pocketing structures disclosed herein also make heating up the bump during hybridization possible, which can dramatically reduce the pressing force required for good interconnection as well as uniformity for large sized dies. The high stress caused by the pressing/expanding of bumps over the thick dielectric can also be lowered considerably compared with traditional techniques. The disclosed structures can therefore significantly reduce the risks that traditional processes face during pressing. Due to high aspect ratio bumps that can be locked within the pockets, this disclosed structures can also be favorable for alignment by avoiding slippage and misalignment during pressing.

The methods and systems of the present disclosure, as described above and shown in the drawings, provide for bump structures for joining FPA components and the like with superior properties including ease of manufacture, and reduced size. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A system comprising:
a device substrate;
a layer of insulating material on the device substrate with pockets therein; and
a respective electrically conductive bump seated in each pocket, wherein the layer of insulating material is thicker than the bumps are tall so that the bumps are recessed within the pockets to form female bump structures for electrical connection with corresponding male bump structures, wherein for each respective bump there is a height of the insulating material to width of the bump aspect ratio greater than or equal to 2 wherein the height of the insulating material is normal to the device substrate and the width of the bump is normal to height.

2. The system as recited in claim 1, wherein the device substrate includes a photodiode array (PDA), and further comprising a read-out integrated circuit (ROIC) with male bump structures aligned with and electrically connected to the female bump structures.

3. The system as recited in claim 2, wherein the device substrate that includes the PDA is spaced apart over 5 µm from a device substrate of the ROIC.

4. The system as recited in claim 2, wherein the PDA and ROIC define a plurality of pixels, wherein the plurality of pixels have a pitch size, wherein the pitch size is less than 10 µm.

5. The system as recited in claim 1, wherein the device substrate includes a read-out integrated circuit (ROIC), and further comprising a photodiode array (PDA) with male bump structures aligned with and electrically connected to the female bump structures.

6. The system as recited in claim 5, wherein the device substrate that includes the ROIC is spaced apart over 5 µm from a device substrate of the PDA.

7. The system as recited in claim 5, wherein the PDA and ROIC define a plurality of pixels, wherein the plurality of pixels have a pitch size, wherein the pitch size is less than 10 µm.

* * * * *